(12) United States Patent
Hayakawa

(10) Patent No.: US 6,437,603 B2
(45) Date of Patent: Aug. 20, 2002

(54) SEMICONDUCTOR INTEGRATED CIRCUIT HAVING LOGICAL OPERATION FUNCTION

(75) Inventor: Shigeyuki Hayakawa, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/797,137

(22) Filed: Feb. 28, 2001

(30) Foreign Application Priority Data

Feb. 29, 2000 (JP) ........................................ 2000-053674

(51) Int. Cl.[7] ............................................ H03K 19/096
(52) U.S. Cl. .............................. 326/95; 326/93; 326/98
(58) Field of Search .............................. 326/93, 95, 98; 327/208–212, 214, 215; 365/203

(56) References Cited

U.S. PATENT DOCUMENTS

| | | | |
|---|---|---|---|
| 4,910,466 A | | 3/1990 | Kiuchi et al. |
| 6,107,834 A | * | 8/2000 | Dai et al. ........................ 326/98 |
| 6,282,140 B1 | * | 8/2001 | Phan et al. ............ 365/230.02 |
| 6,292,029 B1 | * | 9/2001 | Kumar et al. ................. 326/98 |

FOREIGN PATENT DOCUMENTS

JP 11-016366 1/1999

OTHER PUBLICATIONS

Paper Abstracts, FP 15.1: A 1.0GHz Single–Issue 65b Power PC Integer Processor, 1998 International Solid–State Circuits Conference, 1997 Symposium, IBM Austin Research Lab., Austin TX, 17 pages.

* cited by examiner

Primary Examiner—Michael Tokar
Assistant Examiner—Vibol Tan
(74) Attorney, Agent, or Firm—Gray Cary Ware & Freidenrich LLP

(57) ABSTRACT

It is an object of the present invention to provide a semiconductor integrated circuit capable of stable operating at high speed.

A semiconductor integrated circuit according to the present invention includes three pieces of first logic operation circuits 1a, 1b and 1c, keeper circuits 2a, 2b and 2c each of which holds output logics of the first logic operation circuits 1a, 1b and 1c, and three inverters IVa, IVb and IVc connected to output terminals of the first logic operation circuits 1a, 1b and 1c, respectively. When an output of any one first logic operation circuit turns to a low level, outputs of the other first logic operation circuits are forcibly set to a high level, and any one output terminal can be hence solely set on the high level. Further, when an output A(0) of the first logic operation circuit 1a changes from the high level to the low level, the corresponding PMOS transistors Q10 and Q11 are turned off, and thus the PMOS transistors Q10 and Q11 do not prevent a change in the output of the first logic operation circuit 1a, thereby increasing the operating speed of the semiconductor integrated circuit.

20 Claims, 12 Drawing Sheets

SEMICONDUCTOR INTEGRATED CIRCUIT HAVING LOGICAL OPERATION FUNCTION

CROSS REFERENCE TO RELATED APPLICATIONS

The subject application is related to subject matter disclosed in Japanese Patent Application No. H12-53674 filed on Feb. 29, 2000 in Japan to which the subject application claims priority under Paris Convention and which is incorporated herein by reference.

BACKGROUND OF THE INVENTION

1. Field of the Invention

The present invention relates to a semiconductor integrated circuit such as a processor, and especially, it relates to a semiconductor integrated circuit having a keeper circuit holding a signal indicative of a logical operation result.

2. Related Background Art

A node which is called a dynamic node whose logic dynamically changes in response to logic of an input signal exists inside a semiconductor integrated circuit. It is often the case that a keeper circuit is connected to this kind of node in order to avoid an unintentional change in the logic.

FIG. 1 is a circuit diagram showing a prior art keeper circuit and illustrates an example of constituting the keeper circuit by a PMOS transistor Q51. The keeper circuit shown in FIG. 1 is connected to input/output terminals of an inverter IV51, and an input of the inverter IV51 is maintained at a high level when an output of the inverter IV51 turns to a low level.

In the circuit shown in FIG. 1, however, since the PMOS transistor Q51 tries to maintain the high level when the input of the inverter IV51 is changed from the high level to the low level, and hence it disadvantageously takes time until the output logic of the inverter IV51 turns to the low level. Further, when the drive capability of the PMOS transistor Q51 is sufficiently large, the output logic of the inverter IV51 may not turn to the low level.

On the other hand, FIG. 2 is a circuit diagram showing a convention example in which a keeper circuit consisting of PMOS transistors Q52 and Q53 is connected to output terminals of NOR operation circuits 51 and 52, and this is a circuit diagram disclosed in FIG. 6 of Japanese Patent Application Laid-open No. 166216/1997. The PMOS transistors Q52 and Q53 shown in FIG. 2 are connected between input/output terminals of inverters IV52 and IV53. When the outputs of the inverters IV52 and IV53 turn to the low level, the PMOS transistors Q52 and Q53 are turned on to maintain inputs of the inverters IV52 and IV53 on the high level.

The circuit shown in FIG. 2 also has such a problem as that it takes a long time to change a logic of output signals from the inverters IV52 and IV53 when the logic of the input signal has varied, as similar to the circuit illustrated in FIG. 1. Furthermore, when the drive capability of the PMOS transistors Q52 and Q53 is too large, the logic of output signals from the inverters IV52 and IV53 may not change even if the logic of the input signal has varies.

On the other hand, FIG. 3 is a circuit diagram presented in ISSCC'98 ("A 1.0 GHz Single-Issure 64 bit Power PC Integer Processor" J. Silberman, et. al, IBM Austin Research Lab. ISSCC Session FP 15.1, Slide Supplement).

The circuit shown in FIG. 3 is different from the circuit of FIG. 2 in that a PMOS transistor Q54 and an NMOS transistor Q55 which are connected in series are newly provided at rear stages of NOR operation circuits 51 and 52 instead of the NAND gates G51 and G52.

The circuit shown in FIG. 3 is also provided with a keeper circuit consisting of the PMOS transistor Q52, and has the same problem as that of the circuit of FIG. 2.

On the other hand, FIG. 4 is a circuit diagram of a dual rail which outputs a result of an NOR operation and a result of an NAND operation carried out between two input signals. The circuit shown in FIG. 4 includes two NMOS transistors Q56 and Q57 which are connected to each other in parallel to execute the NOR operation, two NMOS transistors Q58 and Q59 which are connected to each other in series to execute the NAND operation, and PMOS transistors Q60 and Q61 which are connected to drain terminals of the transistors Q56 and Q57 and a drain terminal of the transistor Q58 and cross-multiplied to each other.

The PMOS transistors Q60 and Q61 acts as keeper circuits which prevent fluctuations in each drain voltage of the transistors Q56, Q57 and Q58.

In the circuit shown in FIG. 4, however, when the logic of an input signal is changed and each drain voltage of the transistors Q56, Q57 and Q58 is thereby about to vary, the PMOS transistors Q60 and Q61 operate so as to prevent the change of each drain voltage, and hence it disadvantageously takes time to change the logic of an output signal. Further, if the drive capability of the PMOS transistors Q60 and Q61 is high, the output logic may not change.

On the other hand, FIG. 5 is a circuit diagram showing a semiconductor integrated circuit having a latch load circuit 53 for holding a signal indicative of a result of the NOR operation and a signal indicative of a result of the NAND operation, these arithmetic operations being executed between two input signals.

The latch load circuit 53 shown in FIG. 5 includes transistors Q60 and Q62 connected in series between a power supply terminal and a drain terminal of the transistor Q57, transistors Q61 and Q63 connected in series between the power supply terminal and a drain terminal of the transistor Q58, and a transistor Q64 connected between source terminals of the transistors Q62 and Q63.

The transistors Q60 and Q61 are cross-multiplied to each other, and the transistors Q62 and Q63 are also cross-multiplied to each other.

The NOR operation result of the input signals is outputted from a connection point CN1 between the transistor Q60 and the transistor Q62, and the NAND operation result of the input signals is outputted from a connection point CN2 between the transistor Q61 and the transistor Q63. A transistor for pre-charge is connected to each of the connection points CN1 and CN2.

The latch load circuit 53 latches drain voltages of the transistors Q60 and Q62 and drain voltages of the transistors Q61 and Q63 by using an edge of a clock signal CLK. The semiconductor integrated circuit shown in FIG. 5 outputs differential signals each of which has the logic different from each other.

The semiconductor integrated circuit shown in FIG. 5, however, constantly outputs differential signals even if only one of the logic is utilized, which leads to a problem of increase in the circuit scale. Furthermore, when the semiconductor integrated circuit shown in FIG. 5 is used only when the differential signals are required, the application range is narrowed, thereby lowering the utility value.

SUMMARY OF THE INVENTION

In view of the above-described problems in the prior art, it is an object of the present invention to provide a semiconductor integrated circuit capable of stable operating at high speed.

To achieve this object, according to the present invention, there is provided a semiconductor integrated circuit having a logical operation function, comprising:

at least three of first logic operating means configured to output the results of different logic operations executed with respect to a plurality of input signals, any one of said at least three of first logic operating means outputting a signal having first logic in accordance with logic of said plurality of input signals; and a plurality of keeper circuits which are provided respectively corresponding to said at least three of first logic operating means and can maintain an output voltage of said corresponding first logic operating means at a voltage in accordance with second logic, wherein each of said plurality of keeper circuits forcibly sets an output from said corresponding logic arithmetic operating means to said second logic when an output from said first logic operating means other than said corresponding first logic operating means is said first logic.

According to the present invention, when the output logic of any first logic operating means changes, the corresponding keeper circuit operates so that the output logic of the first logic operating means varies, thereby increasing the logic change speed of the first logic operating means. Further, when an output from the first logic operating means other than the corresponding first logic operating means becomes the first logic, the keeper circuit forcibly sets the output from the corresponding first logic operating means to the second logic. As a result, fluctuations in the output logic of the semiconductor integrated circuit can be suppressed, thereby stabilizing the operation.

Additionally, according to the present invention, there is provided a semiconductor integrated circuit having a logical operation function, comprising:

at least two of first logic operating means configured to output the results of different logic operations executed with respect to a plurality of input signals, only one of said at least two of first logic operating means outputting a signal having first logic in accordance with logic of said plurality of input signals; and a plurality of keeper circuits provided respectively corresponding to said at least two of first logic operating means, wherein each of said plurality of keeper circuits includes:

a first transistor capable of maintaining an output voltage of said corresponding first logic operating means at a voltage in accordance with second logic; and second logic operating means configured to execute a predetermined logic operation by using output signals from said plurality of first logic operating means, said first transistor being controlled to be turned on/off based on output logic of said second logic operating means.

Moreover, according to the present invention, there is provided a semiconductor integrated circuit having a logical operation function, comprising:

at least two of first logic operating means configured to output the results of different logic operations executed with respect to a plurality of input signals, only one of said at least two of first logic operating means outputting a signal having first logic in accordance with logic of said plurality of input signals; and a plurality of keeper circuits provided respectively corresponding to said at least two of first logic operating means, wherein each of said plurality of keeper circuits includes:

a first transistor capable of maintaining an output voltage of said corresponding first logic operating means at a voltage in accordance with second logic;

a second transistor which is cross-multiplied with said first transistor and is capable of outputting a voltage in accordance with said second logic; and a third transistor configured to output a voltage in accordance with an output from said first logic operating means other than said corresponding first logic operating means when output logic of said corresponding first logic operating means is said second logic, said second transistor being turned on to output a voltage in accordance with said second logic when an output from said corresponding first logic operating means is said first logic, said first transistor being turned on to maintain an output voltage of said corresponding first logic operating means at a voltage in accordance with said second logic when an output logic of said corresponding keeper circuit is said first logic.

In addition, according to the present invention, there is provided a semiconductor integrated circuit having a logical operation function, comprising:

at least two of first logic operating means configured to output results of different logic operations executed with respect to a plurality of input signals, at least one of said at least two of first logic operating means outputting a signal having first logic in accordance with logic of said plurality of input signals;

second logic operating means which are provided respectively corresponding to said at least two of first logic operating means and execute a predetermined logic operation by using output signals of said plurality of first logic operating means;

first and second transistors which are provided respectively corresponding to said at least two of first logic operating means and connected in series; and pre-charging means capable of maintaining a voltage of a connection point of said first and second transistors at a predetermined voltage, wherein said first and second transistors are controlled to be turned on/off based on an output from said second logic operating means, said second logic operating means outputting a signal in accordance with an output of said first logic operating means other than said corresponding first logic operating means when said first transistor is turned on and outputting a signal in accordance with output logic of said corresponding first logic operating means when said first transistor is turned off.

DESCRIPTION OF THE PREFERRED EMBODIMENTS

A semiconductor integrated circuit according to the present invention will now be described in detail with reference to the accompanying drawings.

First Embodiment

Figure 6:
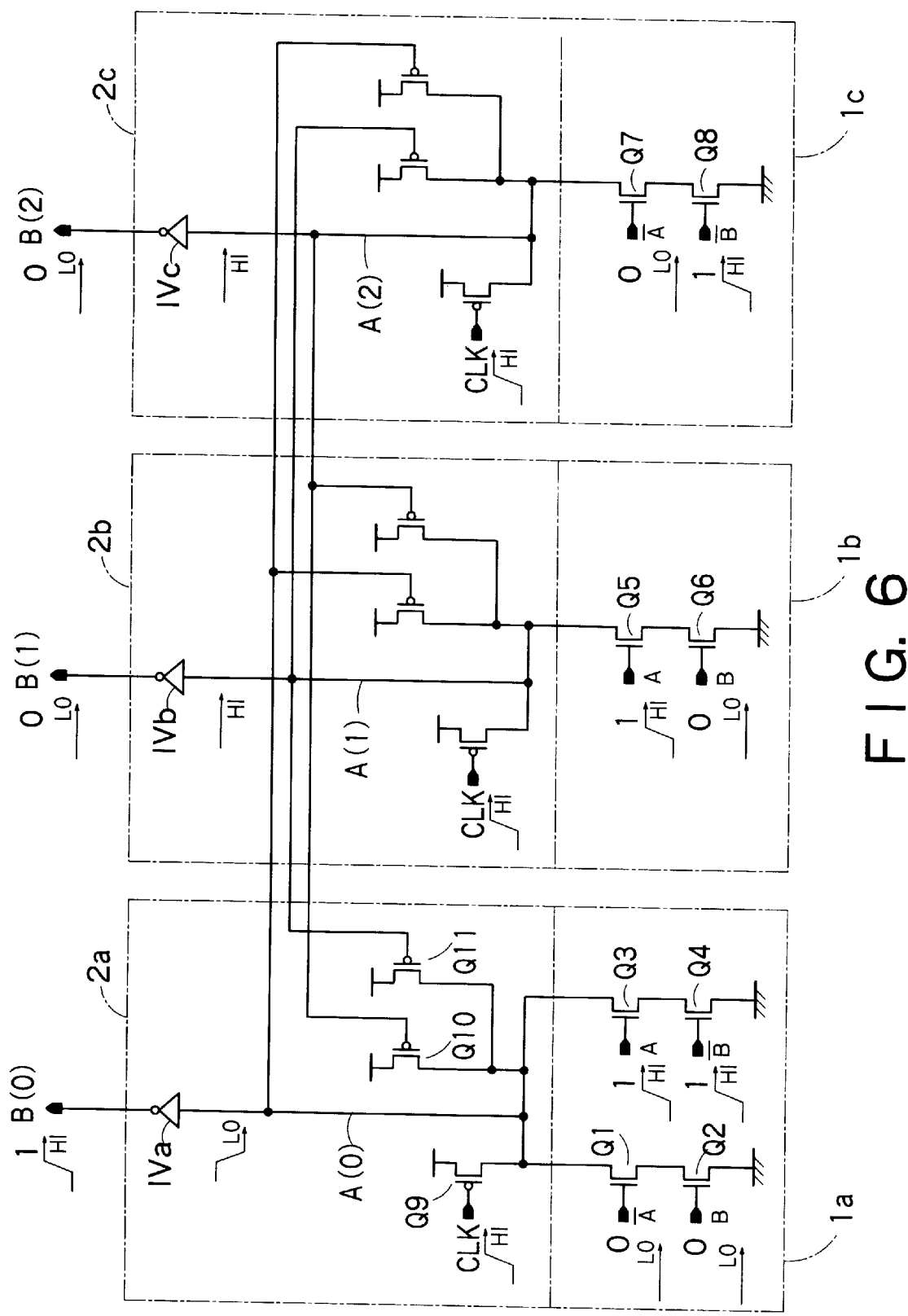
FIG. 6 is a circuit diagram of a first embodiment of a semiconductor integrated circuit according to the present invention.

FIG. 6 is a circuit diagram of a first embodiment of a semiconductor integrated circuit according to the present invention. The circuit shown in FIG. 6 sets only one of three output terminals to a high level.

The semiconductor integrated circuit shown in FIG. 6 includes three pieces of first logic operation circuits (first logic operating means) 1a, 1b and 1c, three keeper circuits 2a, 2b and 2c for respectively holding output logic of these first logic operation circuits 1a, 1b and 1c, and inverters IVa, IVb and IVc for inverting outputs from these first logic operation circuits 1a, 1b and 1c.

The first logic operation circuit 1a includes NMOS transistors Q1 and Q2 connected in series for executing an NAND operation of two input signals /A and B, and NMOS transistors Q3 and Q4 connected in series for executing the NAND operation of two input signals A and /B. The NMOS transistors (Q1, Q2) and (Q3, Q4) are connected in parallel, and the first logic operation circuit 1a outputs the logical add signal A(0)=/(/A+B)+/(A B).

The first logic operation circuit 1b has NMOS transistors Q5 and Q6 connected in series and executes the NAND arithmetic operation of two input signals A and B to output A(1)=/(A B). The first logic operation circuit 1c has NMOS transistors Q7 and Q8 connected in series and executes the NAND arithmetic operation of two input signals /A and /B to output A(2)=(/A+/B).

Only one of respective outputs from the three first logic operation circuits 1a, 1b and 1c turns to the low level, and other outputs turn to the high level.

The keeper circuits 2a, 2b and 2c include a PMOS transistor (pre-charging means) Q9 for pre-charge which is capable of maintaining output voltages of the corresponding first logic operation circuits 1a, 1b and 1c at the high level, and two PMOS transistors (a plurality of transistors) Q10 and Q11 connected in parallel, respectively.

The PMOS transistor Q9 for pre-charge maintains the output of the corresponding first logic operation circuit at the high level when a clock signal CLK is on the low level. Gate terminals of the two PMOS transistors Q10 and Q11 connected in parallel are connected to output terminals of the first logic operation circuits other than the corresponding first logic operation circuit, respectively.

The operation of the circuit shown in FIG. 6 will now be described. When the clock signal CLK turns to the low level, outputs A(0), A(1) and A(2) from the first logic operation circuits 1a, 1b and 1c are all maintained at the high level.

When the clock signal CLK turns to the high level, only one of outputs from the first logic operation circuits 1a, 1b and 1c turns to the low level. Now it is assumed that the output of the first logic operation circuit 1a turns to the low level.

In this case, the both PMOS transistors Q10 and Q11 in the keeper circuits 2b and 2c corresponding to the first logic operation circuits 1b and 1c are turned on, and the outputs of the first logic operation circuits 1b and 1c are forcibly maintained at the high level. Further, the PMOS transistors Q10 and Q11 in the keeper circuit 2a corresponding to the first logic operation circuit 1a are turned off, and the output of the first logic operation circuit 1a is maintained at the low level as long as the logic of the input signal does not vary.

As described above, in the first embodiment, when the output of any one of the three first logic operation circuits 1a, 1b and 1c turns to the low level, the outputs of the other first logic operation circuits are forcibly set at the high level, and hence only one output terminal can be set at the high level.

Figure 1:
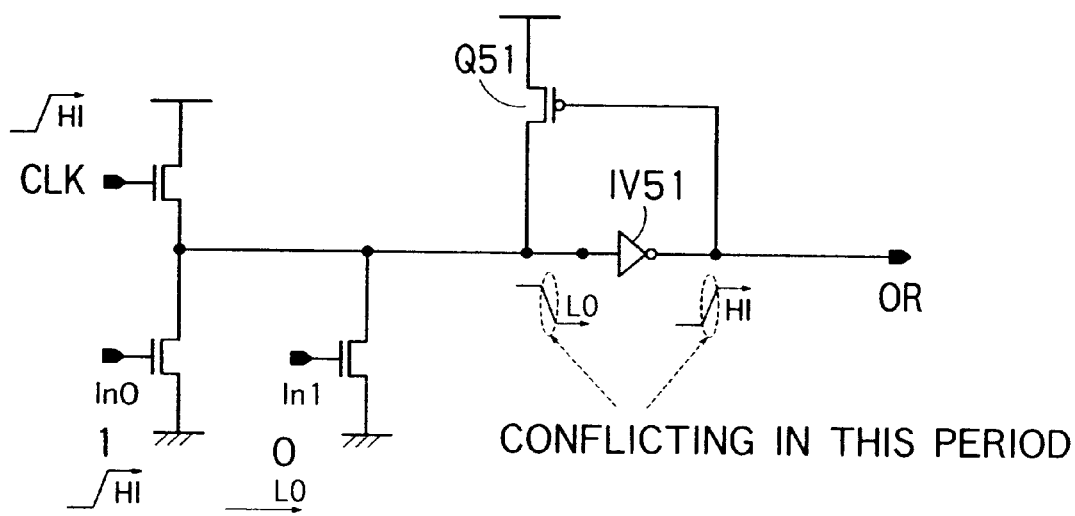
FIG. 1 is a circuit diagram showing a conventional keeper circuit.
Figure 2:
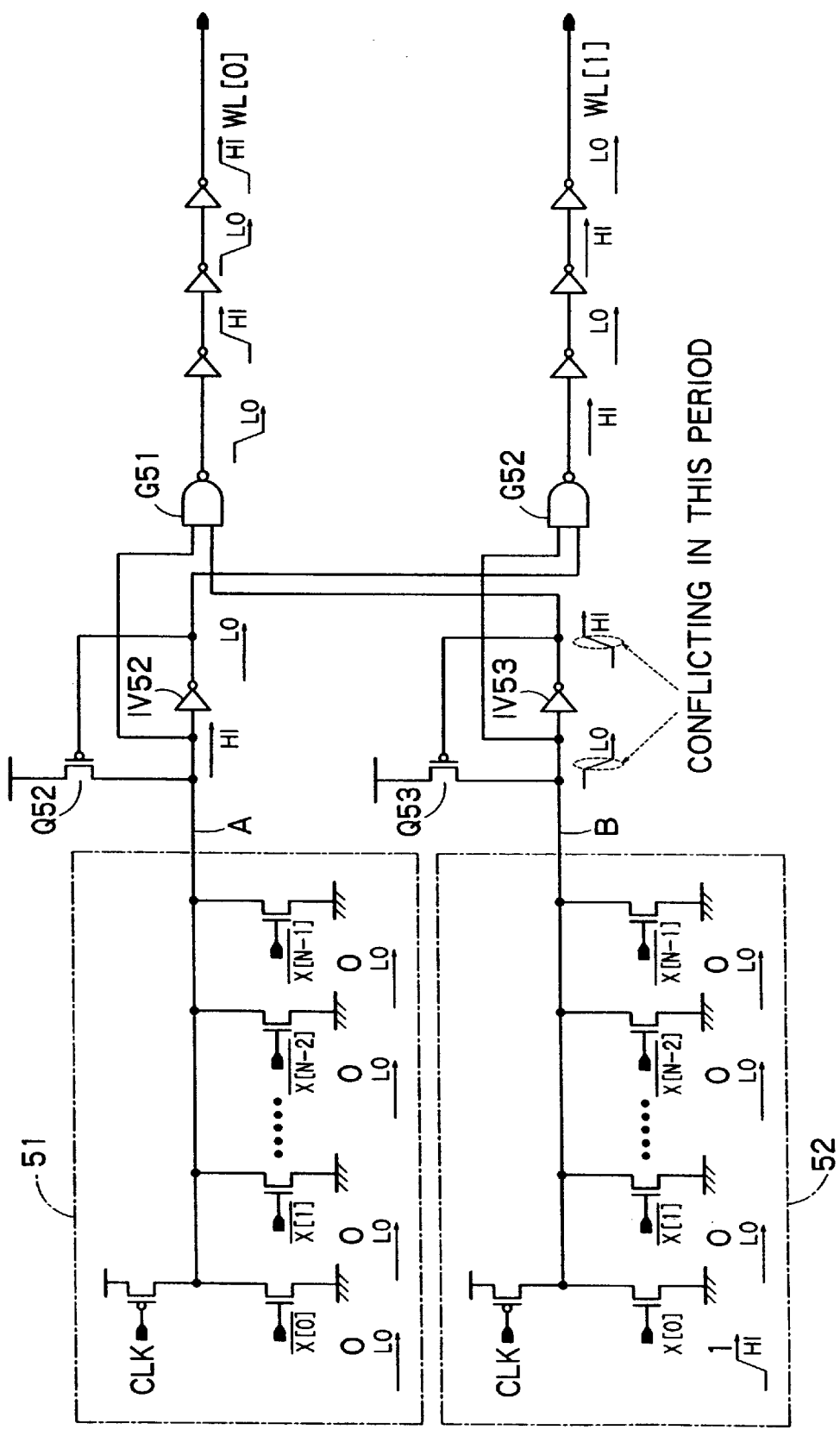
FIG. 2 is a circuit diagram showing a conventional example where the keeper circuit is connected to an output terminal of a NOR operation circuit.
Figure 3:
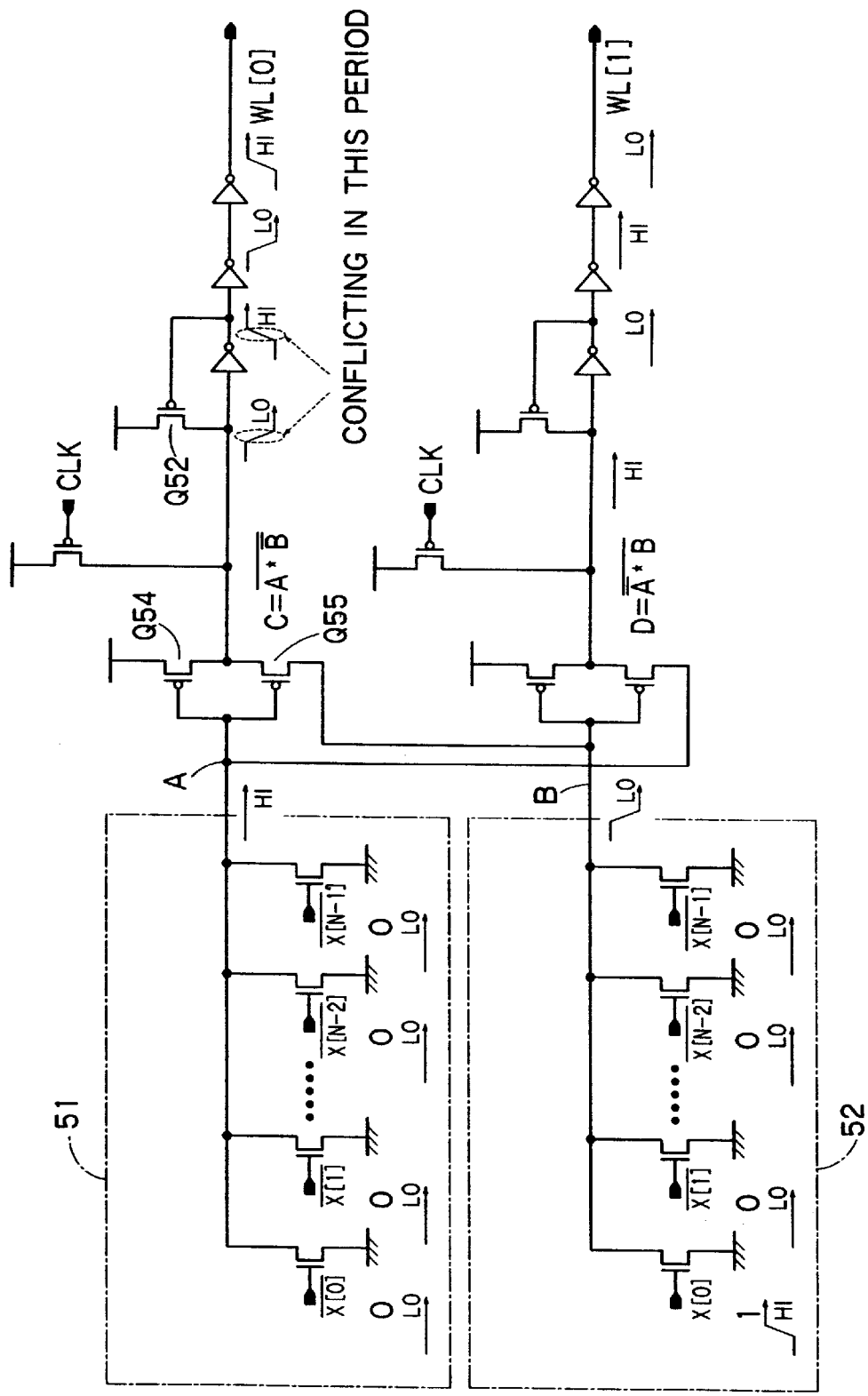
FIG. 3 is a circuit diagram presented in ISSCC' 98.
Figure 4:
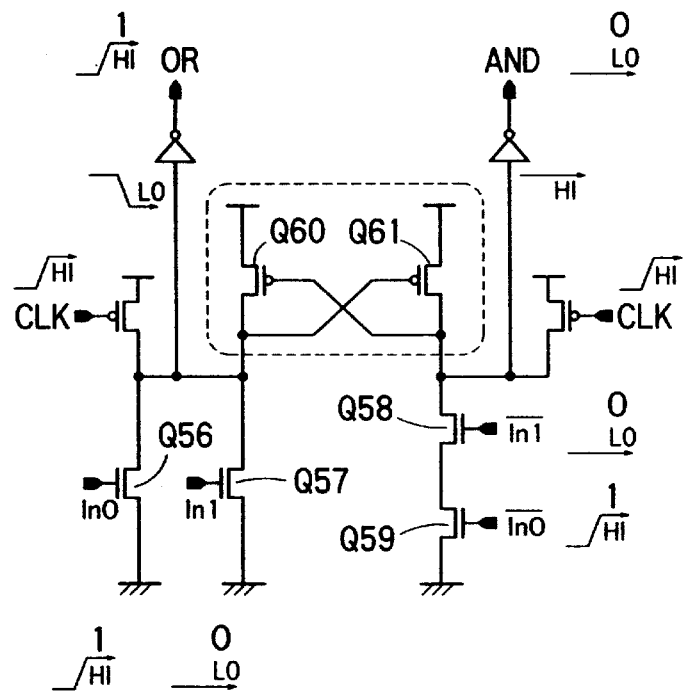
FIG. 4 is a conventional circuit diagram of a dual rail.
Figure 5:
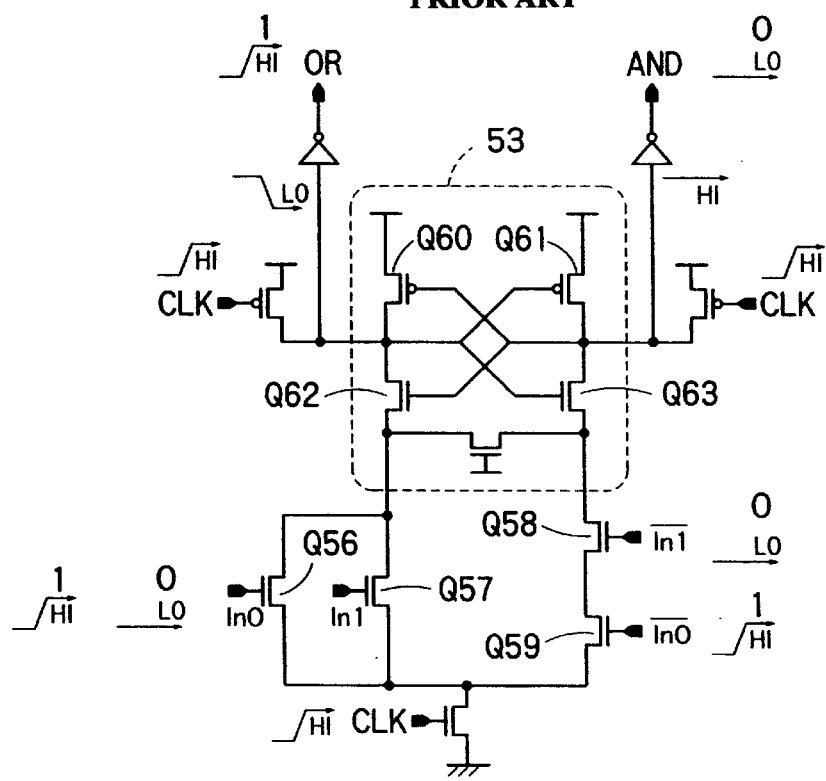
FIG. 5 is a circuit diagram of a semiconductor integrated circuit having a latch load circuit.

Further, as different from the keeper circuit shown in FIG. 1, when the output A(0) of the first logic operation circuit 1a is changed from the high level to the low level, the corresponding PMOS transistors Q10 and Q11 are turned off. Therefore, the PMOS transistors Q10 and Q11 do not prevent the output of the first logic operation circuit 1a from changing. Accordingly, the operating speed of the semiconductor integrated circuit is increased.

Furthermore, when the output of any one of the first logic operation circuits turns to the low level, the outputs of the other first logic operation circuits are forcibly set at the high level. Thus, the multiple output terminals do not simultaneously turns to the high level, thereby stabilizing the operation.

In addition, in the circuit configuration of FIG. 6, when the number of the first logic operation circuit is equal to or more than four, it is possible to apply only by increasing the number of the PMOS transistors Q10 and Q11 connected in parallel. Therefore, the circuit can be configured irrespective of the number of the first logic operating means, thereby widening the application range.

Second Embodiment

A second embodiment is a variation of the first embodiment. In the second embodiment, NOR gates and one PMOS transistor are provided instead of providing multiple PMOS transistors in the keeper circuit.

Figure 7:
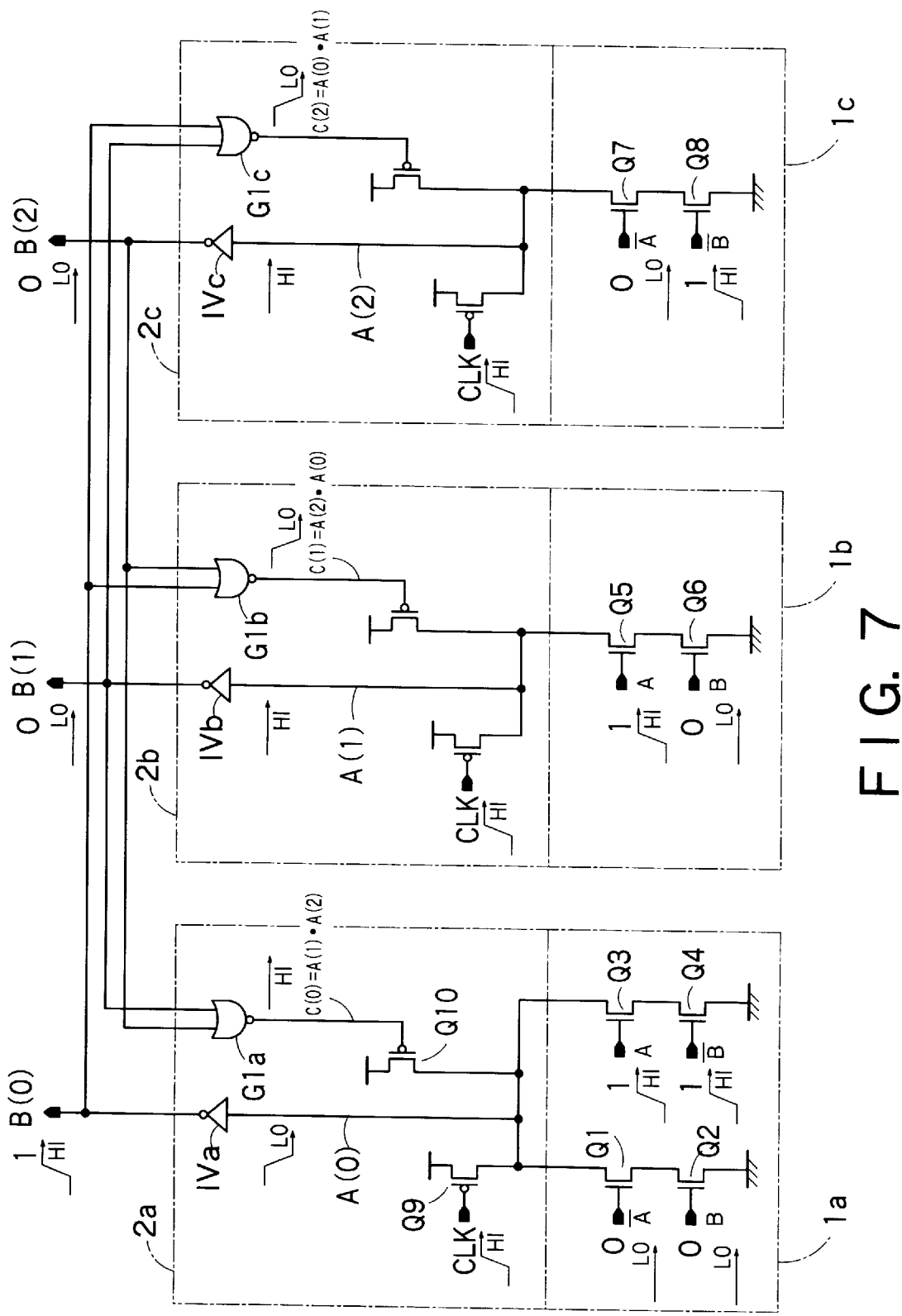
FIG. 7 is a circuit diagram of a second embodiment of a semiconductor integrated circuit according to the present invention.

FIG. 7 is a circuit diagram of the second embodiment of a semiconductor integrated circuit according to the present invention. In FIG. 7, the same reference numerals is denoted to constituent parts common to FIG. 6, and points different from FIG. 6 will be mainly described hereinafter.

The circuit shown in FIG. 7 is different from that in FIG. 6 in that the PMOS transistor Q11 is eliminated and NOR gates (second logic operating means) G1a, G1b and G1c are newly provided. The NOR gates G1a, G1b and G1c are provided respectively corresponding to the first logic operation circuits 1a, 1b and 1c. To input terminals of the NOR gates G1a, G1b and G1c are connected output terminals of the first logic operation circuits other than the corresponding first logic operation circuit.

Outputs from the NOR gates G1a, G1b, and G1c turns to the low level when any one of outputs from the first logic operation circuits other than the corresponding first logic arithmetic circuit turns to the high level. When the outputs from the NOR gates G1a, G1b and G1c turn to the low level, the corresponding PMOS transistor Q10 is turned on, and the out put of the corresponding first logic operation circuit turns to the low level.

In the second embodiment, when any one of outputs from the first logic operation circuits 1a, 1b and 1c turns to the low level, the outputs of the other first logic operation circuits are forcibly set to the high level as similar to the first embodiment. Therefore, the output logics of the first logic operation circuits 1a, 1b and 1c can be stably maintained without providing such a keeper circuit as shown in FIG. 1. Therefore, the operating speed is increased, and the operation is stabilized.

Third Embodiment

A third embodiment is a variation of the second embodiment. In the third embodiment, an NMOS transistor Q12 is connected between the PMOS transistor Q10 and the first logic operation circuits 1a, 1b and 1c.

Figure 8:
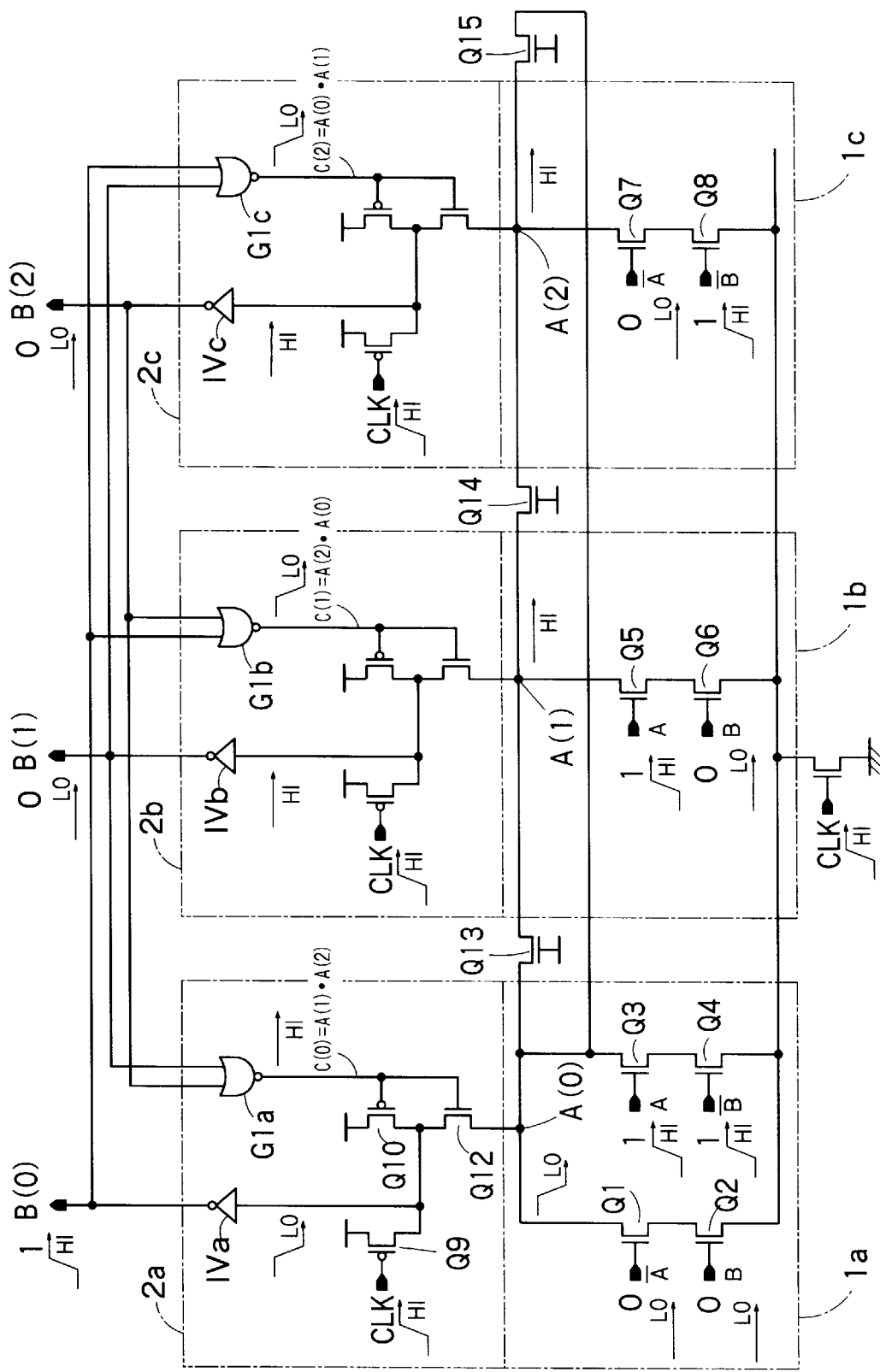
FIG. 8 is a circuit diagram of a third embodiment of a semiconductor integrated circuit according to the present invention.

FIG. 8 is a circuit diagram of the third embodiment of a semiconductor integrated circuit according to the present invention. In FIG. 8, the same reference numerals are denoted to constituent parts common to FIG. 6. Points different from FIG. 6 will now be mainly described hereinafter.

The keeper circuits 2a, 2b and 2c shown in FIG. 8 are different from the keeper circuits 2a, 2b and 2c depicted in FIG. 6 in that an NMOS transistor (second transistor) Q12 is connected between the PMOS transistor (first transistor) Q10 and the first logic operation circuits 1a, 1b and 1c, and that NMOS transistors (third transistors) Q13 to Q15 are connected between the respective output terminals of the two adjacent first logic operation circuits (1a, 1b), (1b, 1c), and (1c, 1a). Respective gate terminals of the corresponding PMOS transistor Q10 and the NMOS transistor Q12 are connected to the output terminals of the corresponding NOR gates G1a, G1b and G1c.

The NMOS transistor Q12 is turned on when the output from the corresponding NOR gate G1a, G1b or G1c turns to the high level and turned off when it turns to the low level. Assuming that the output of the first logic operation circuit 1a turns to the low level, outputs of the other first logic operation circuits 1b and 1c turn to the high level. Therefore, the output of the NOR gate G1a turns to the high level and the NMOS transistor Q12 is turned on so that the output of the inverter IVa turns to the high level. Consequently, the PMOS transistor Q10 corresponding to the other first logic operation circuits 1b and 1c is turned on, and the outputs of the inverters IVb and IVc turn to the low level.

The NMOS transistors Q13, Q14 and Q15 are constantly in the ON state. The output terminals of all the first logic arithmetic circuits 1a, 1b and 1c are connected in a ring shape through these NMOS transistors Q13, Q14 and Q15. However, since the drive capability of the NMOS transistors Q13, Q14 and Q15 is low, the output terminals of the first logic operation circuits 1a, 1b and 1c are in the moderate short-circuit state and assuredly maintained at the low level except the terminal which is on the high level.

As described above, in the third embodiment, the NMOS transistor Q12 is connected between the output terminals of the first logic operation circuits 1a, 1b and 1c and the input terminals of the inverters IVa, IVb and IVc, and the transistor Q12 is controlled to be turned on/off by the output logic of the NOR gates G1a, G1b and G1c. Therefore, only when the outputs from the first logic operation circuits 1a, 1b and 1c turn to the low level, the corresponding NMOS transistor Q12 can be turned on to set the output of the inverter at the high level.

In other words, the logics of the output terminals B(0) to B(2) in the semiconductor integrated circuit are not affected by the outputs from the first logic operation circuits 1a, 1b and 1c as far as the NMOS transistor Q12 is not turned on, which leads to the stable operation. Moreover, such a keeper circuit as shown in FIG. 1 is no longer necessary, and the operating speed can be hence increased.

Fourth Embodiment

A fourth embodiment is a variation of the third embodiment, and the keeper circuit has a structure different from that in the third embodiment.

Figure 9:
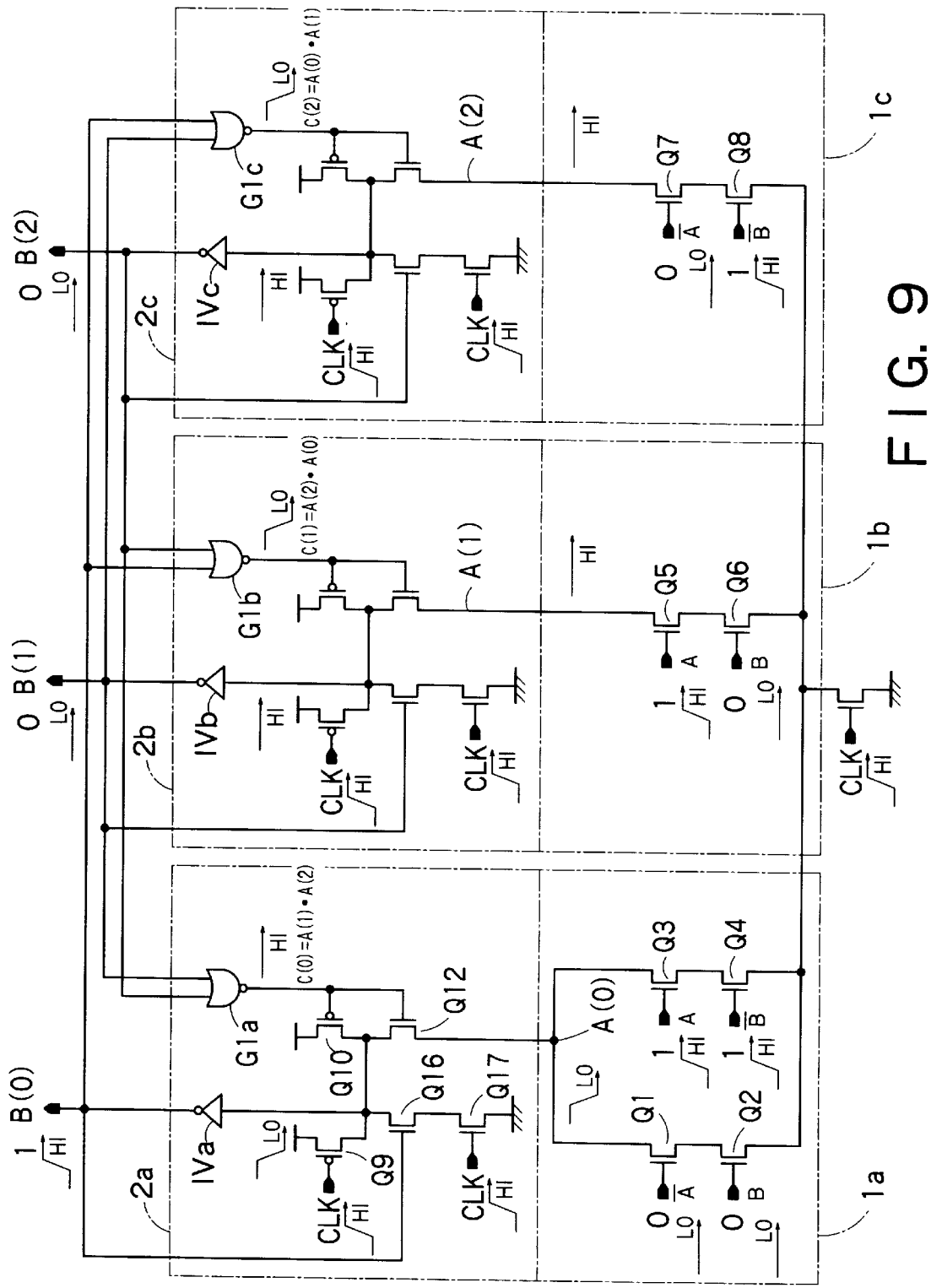
FIG. 9 is a circuit diagram of a fourth embodiment of a semiconductor integrated circuit according to the present invention.

FIG. 9 is a circuit diagram of the fourth embodiment of a semiconductor integrated circuit according to the present invention. In FIG. 9, the same reference numerals are denoted to constituent parts common to FIG. 8, and points different from FIG. 8 will be mainly described hereinafter.

The semiconductor integrated circuit shown in FIG. 9 is different from the circuit illustrated in FIG. 8 in that two NMOS transistors Q16 (third transistor) and Q17 (potential setting means) are connected in series between the drain terminal of the PMOS transistor Q9 for pre-charge and a ground terminal, and that the NMOS transistors Q13 to Q15 between the output terminals of the adjacent first logic operation circuits (1a, 1b) and (1b, 1c) are eliminated.

Since the NMOS transistor Q17 is turned on when the clock signal CLK is on the high level, the connection point between the NMOS transistors Q16 and Q17 is maintained at the low level. For example, when the output terminal B(0) of the semiconductor integrated circuit turns to the high level, the corresponding NMOS transistor Q16 is turned on, and the drain terminal of the PMOS transistor Q10 turns to the low level. Consequently, the output terminal B(0) is maintained at the high level.

As described above, when any one of the output terminals B(0) to B(2) turns to the high level, the NMOS transistor Q16 shown in FIG. 9 operates so as to maintain that state. Therefore, the NMOS transistor between the adjacent first logic operation circuits (1a, 1b) and (1b, 1c) is no longer necessary. Further, as similar to the circuit illustrated in FIG. 8, the logic of the output terminals B(0) to B(2) is not affected by the outputs from the first logic operation circuits 1a, 1b and 1c unless the NMOS transistor Q12 is not turned on in the semiconductor integrated circuit shown in FIG. 9, thereby stabilizing the operation. Furthermore, such a keeper circuit as shown in FIG. 1 is no longer necessary, which improves the operating speed.

Fifth Embodiment

In a fifth embodiment, keeper circuits are added to the semiconductor integrated circuit having a plurality of first logic arithmetic circuits, at least one of the first logic arithmetic circuits outputting a low level signal.

Figure 10:
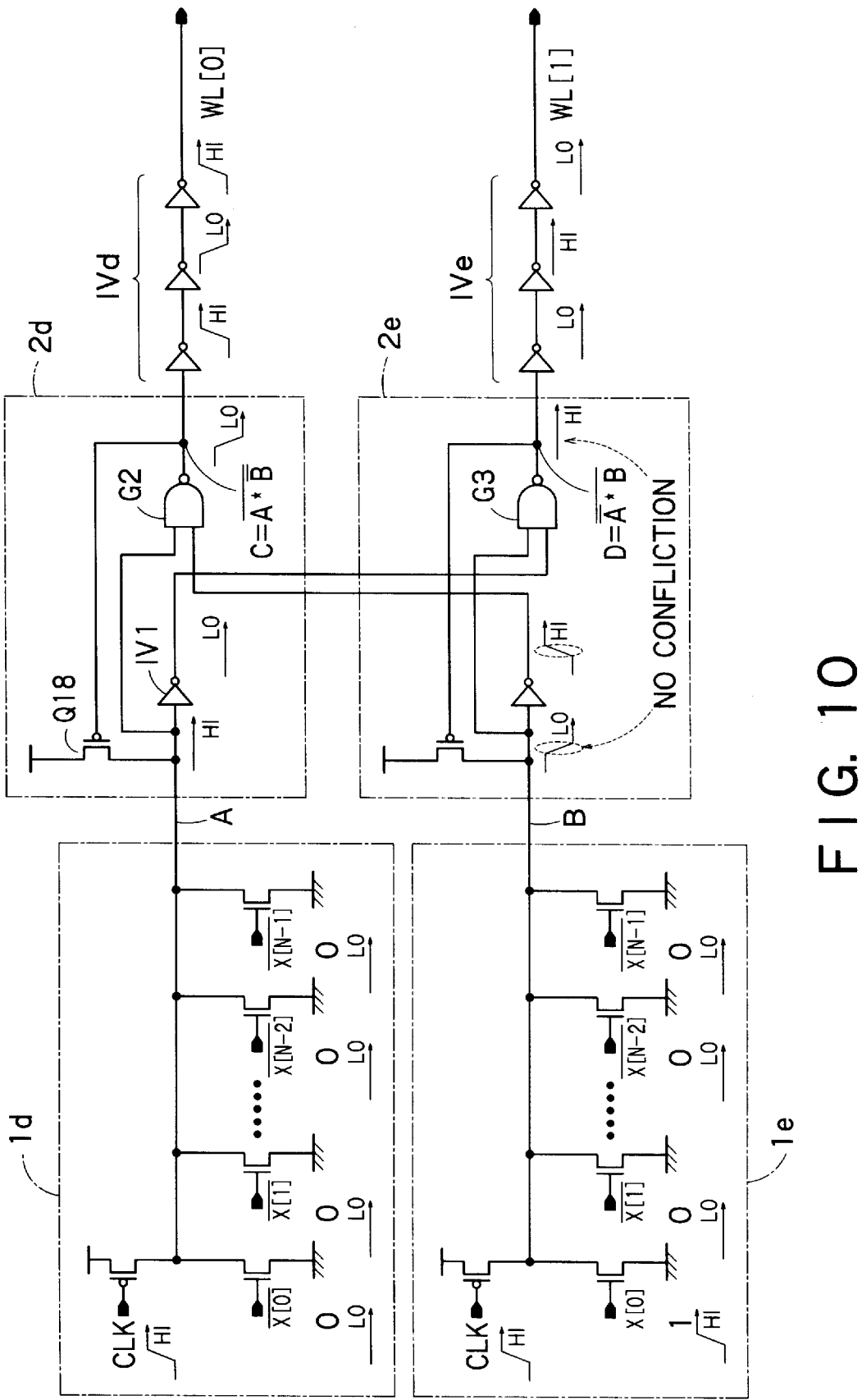
FIG. 10 is a circuit diagram of a fifth embodiment of a semiconductor integrated circuit according to the present invention.

FIG. 10 is a circuit diagram of the fifth embodiment of the semiconductor integrated circuit according to the present invention. The semiconductor integrated circuit shown in FIG. 10 includes two first logic operation circuits 1d and 1e, keeper circuits 2d and 2e respectively corresponding to the first logic operation circuits 1d and 1e, and inverters IVd and IVe.

Outputs from the multiple first logic operation circuits 1d and 1e are set in such a manner that they don't simultaneously turn to the high level even if the logic of the input signal varies. That is, the first logic operation circuits 1d and 1e shown in FIG. 10 function as NOR decoders.

The first logic operation circuit 1d illustrated in FIG. 10 has multiple transistors connected in parallel and calculates /(/X[0]+/X[1]+ . . . +/X[N−2]+/X[N−1]). Moreover, the first logic operation circuit 1e also has multiple transistors connected in parallel and calculates /(X[0]+/X[1]+ . . . +/X[N−2]+/X[N−1]).

The keeper circuits 2d and 2e have an inverter IV1, an NAND gate (second logic operating means) G2, and a PMOS transistor (first transistor) Q18, respectively. The PMOS transistor Q18 is controlled to be turned on/off based on the output from the NAND gate G2. The NAND gate G2 outputs a result of the NAND arithmetic operation executed between the output of the first logic operation circuit 1d and the inverted output of the first logic operation circuit 1e.

An output C from the NAND gate G2 corresponding to the first logic operation circuit 1d becomes C=/A+B. An output D from the NAND gate G3 corresponding to the first logic operation circuit 1e becomes D=A+/B.

When the output from the first logic operation circuit 1d turns to the low level, the output from the corresponding NAND gate G2 turns to the high level, and the corresponding PMOS transistor Q18 is turned off. On the contrary, when the output from the first logic operation circuit 1d turns to the high level, the output of the NAND gate G2 turns to the low level if the output of the other first logic operation circuit 1d is on the low level. Further, the corresponding PMOS transistor Q18 is turned on so that the output of the first logic operation circuit 1d is maintained on the high level.

In case of the semiconductor integrated circuit shown in FIG. 10, when the output from the first logic operation circuit 1d changes from the low level to the high level, the corresponding PMOS transistor Q18 may be possibly turned on by the influence of this change. Even in such a case, however, since the PMOS transistor Q18 operates so as to maintain the output of the first logic operation circuit 1d on the high level, the output of the first logic operation circuit Id is rapidly changed from the low level to the high level, thereby increasing the operating speed.

Sixth Embodiment

A sixth embodiment is a variation of the fifth embodiment. In the sixth embodiment, the PMOS transistor and the NMOS transistor are provided instead of the NAND gates.

Figure 11:
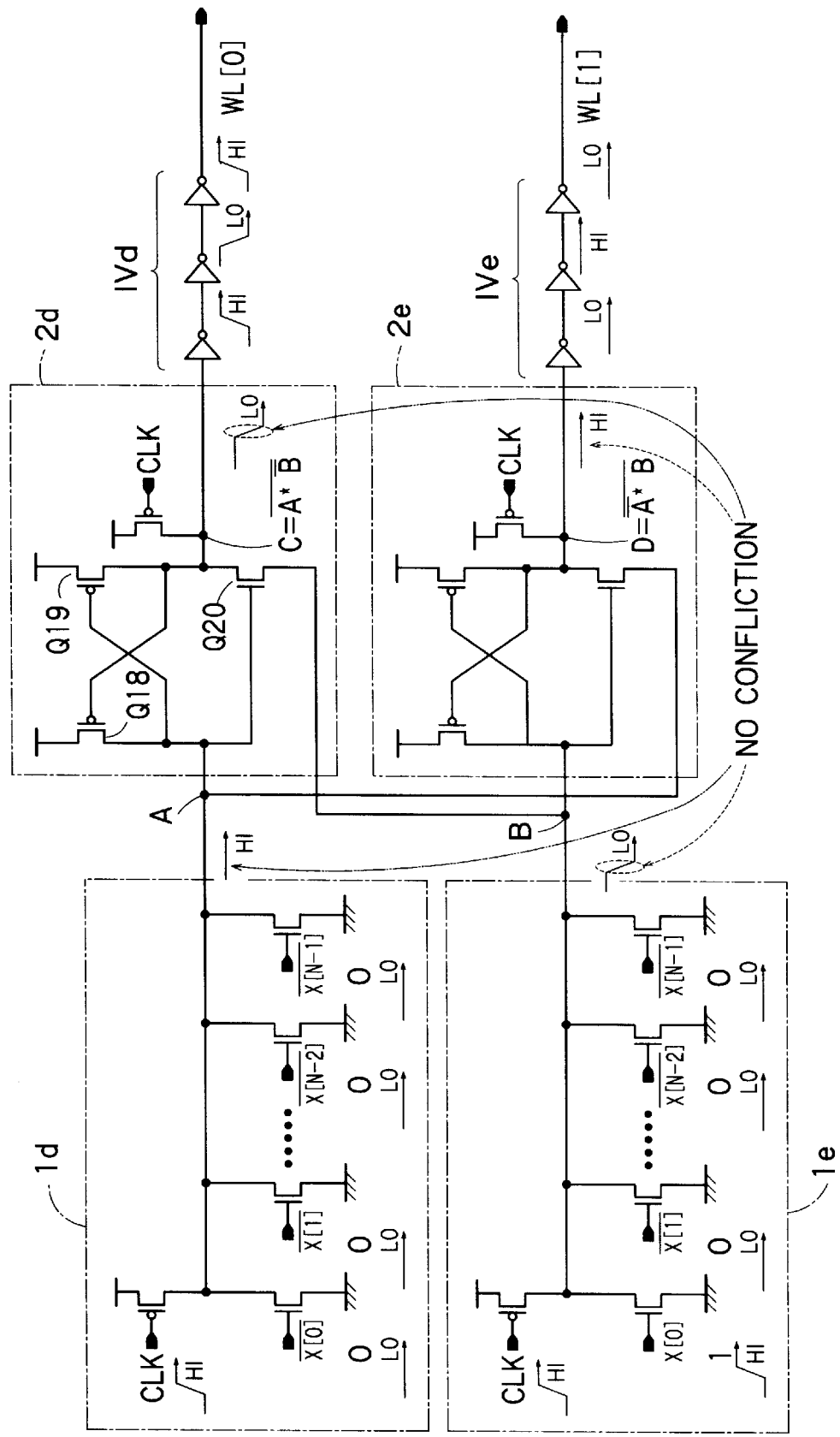
FIG. 11 is a circuit diagram of a sixth embodiment of a semiconductor integrated circuit according to the present invention.

FIG. 11 is a circuit diagram showing the sixth embodiment of a semiconductor integrated circuit according to the present invention. In FIG. 11, the same reference numerals are denoted to constituent parts common to FIG. 10, and a difference of FIG. 11 from FIG. 10 will be mainly described hereinafter.

The circuit shown in FIG. 11 is different from the circuit illustrated in FIG. 10 in the structure of the keeper circuits 2d and 2e. The keeper circuits 2d and 2e shown in FIG. 11 have a PMOS transistor (second transistor) Q19 and an NMOS transistor Q20 which are connected in series in place of the NAND gates G2 and G3, respectively. The PMOS transistor Q19 is cross-multiplied with the PMOS transistor Q18 for pre-charge. A source terminal of the NMOS transistor Q20 is connected to an output terminal of the first logic operation circuit other than the corresponding first logic operation circuit.

Assuming that the output of the first logic operation circuit 1d shown in FIG. 11 turns to the low level, the PMOS transistor Q19 is turned on, and the output of the keeper circuit 2d turns to the high level. At this time, the PMOS transistor Q18 for pre-charge and the NMOS transistor Q20 are turned off.

On the other hand, when the output from the first logic operation circuit 1d turns to the high level, the PMOS transistor Q19 is turned off and the NMOS transistor Q20 is turned on. Further, an output signal of the first logic operation circuit 1e other than the corresponding first logic operation circuit 1d is outputted from the keeper circuit 2d through the NMOS transistor Q20.

As similar to the fifth embodiment, even if the output logics of the first logic operation circuits 1d and 1e change, the keeper circuits 2d and 2e operate so as not to prevent the change in the sixth embodiment, thereby increasing the operating speed.

Seventh Embodiment

A seventh embodiment is also a variation of the fifth embodiment.

Figure 12:
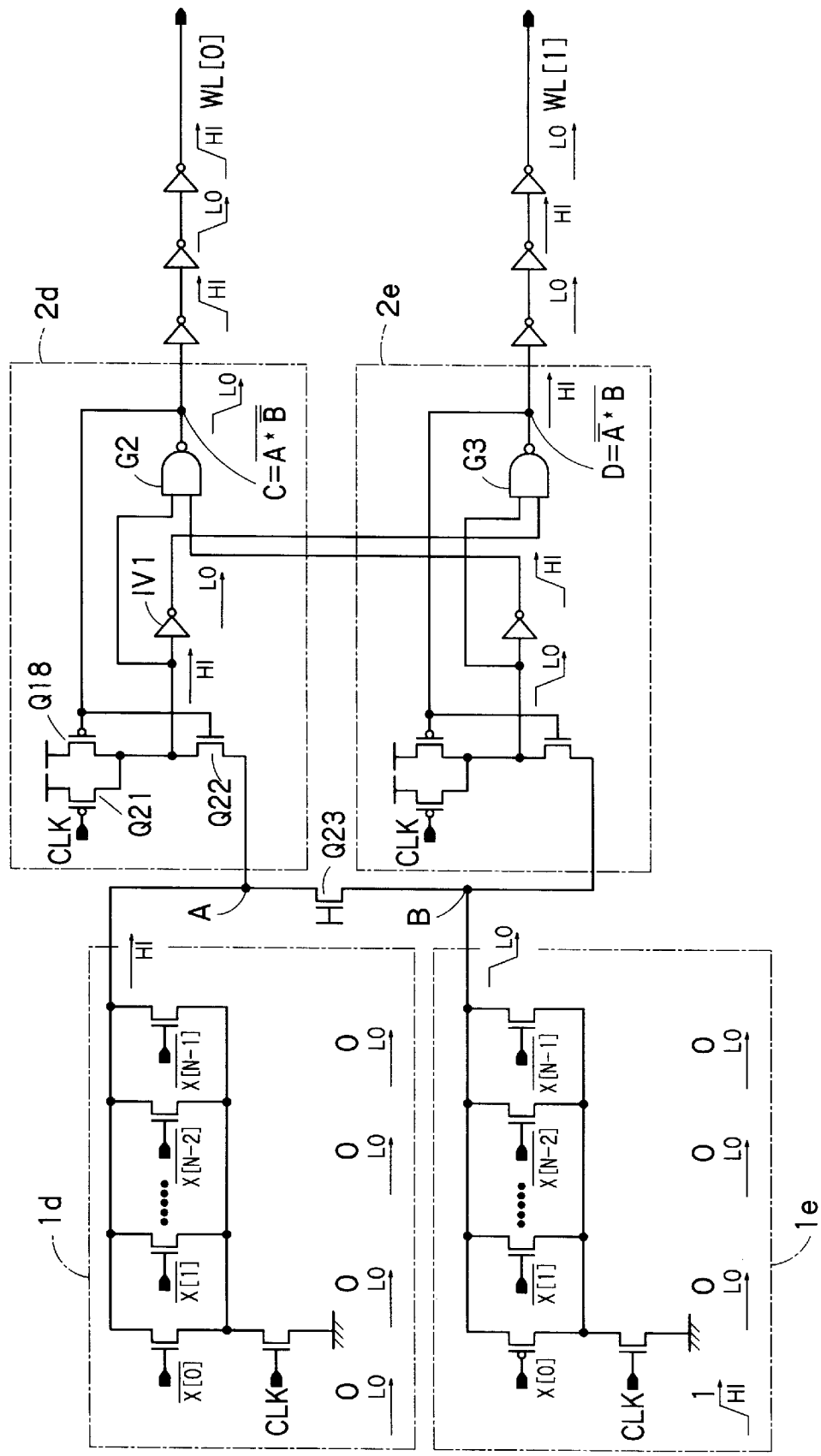
FIG. 12 is a circuit diagram of a seventh embodiment of a semiconductor integrated circuit according to the present invention.

FIG. 12 is a circuit diagram showing the seventh embodiment of a semiconductor integrated circuit according to the present invention. In FIG. 12, the same reference numerals are denoted to constituent parts common to FIG. 10, and a difference of FIG. 12 from FIG. 10 will be mainly described hereunder.

The circuit shown in FIG. 12 is different from the circuit depicted in FIG. 10 in the structure of the keeper circuits 2d and 2e and includes a PMOS transistor (pre-charging means) Q21 connected to the PMOS transistor Q18 in parallel and an NMOS transistor (second transistor) Q22 connected to the NMOS transistor(second transistor) Q18 in series. The PMOS transistor Q21 is periodically turned on/off in synchronization with the clock signal CLK. When the PMOS transistor Q21 is turned on, the connection point between the PMOS transistors Q18 and Q21 is forcibly maintained on the high level.

When the output terminal of the NAND gate G2 turns to the low level, the PMOS transistor Q18 is turned on and the NMOS transistor Q22 is turned off. Thus, the connection point between these transistors Q18 and Q22 turns to the high level. Accordingly, the NAND gate G2 outputs a signal in accordance with the output of the other first logic operation circuit 1e.

On the other hand, when the output terminal of the NAND gate G2 turns to the high level, the PMOS transistor Q18 is turned off and the NMOS transistor Q22 is turned on. Therefore, the output signal of the corresponding first logic operation circuit 1d is inputted to the inverter IV1 through the NMOS transistor Q22. Assuming that the output signal of the first logic operation circuit 1d is on the low level, the output of the NAND gate G2 turns to the high level. On the contrary, when the output signal of the fist logic operation circuit 1d is on the high level, the output of the NAND gate G2 can have the logic in accordance with the output signal of the other first logic operation circuit 1e.

Further, the NMOS transistor Q23 which is constantly in the ON state is connected between the outputs of the adjacent first logic operation circuits 1d and 1e shown in FIG. 12. Since the drive capability of the transistor Q23 is low, the output terminals of the adjacent two first logic operation circuits 1d and 1e slowly vary so as to obtain the same voltage.

As described above, in the seventh embodiment, the PMOS transistor Q21 for pre-charge and the NMOS transistor Q22 for passing/interrupting the output of the first logic operation circuit 1d are added to the structure of the fifth embodiment. Therefore, only when the output of the NAND gate G2 is on the high level, the output of the first logic operation circuit 1d can be supplied to the inverter IV1 to stabilize the output logic.

Additionally, when the output logic of the first logic operation circuit 1d changes, the keeper circuits 2d and 2e operate so as not to prevent the change, thereby improving the operating speed.

Eighth Embodiment

An eighth embodiment is a variation of the seventh embodiment. In the eighth embodiment, a PMOS transistor and an NMOS transistor are newly provided in the keeper circuit.

Figure 13:
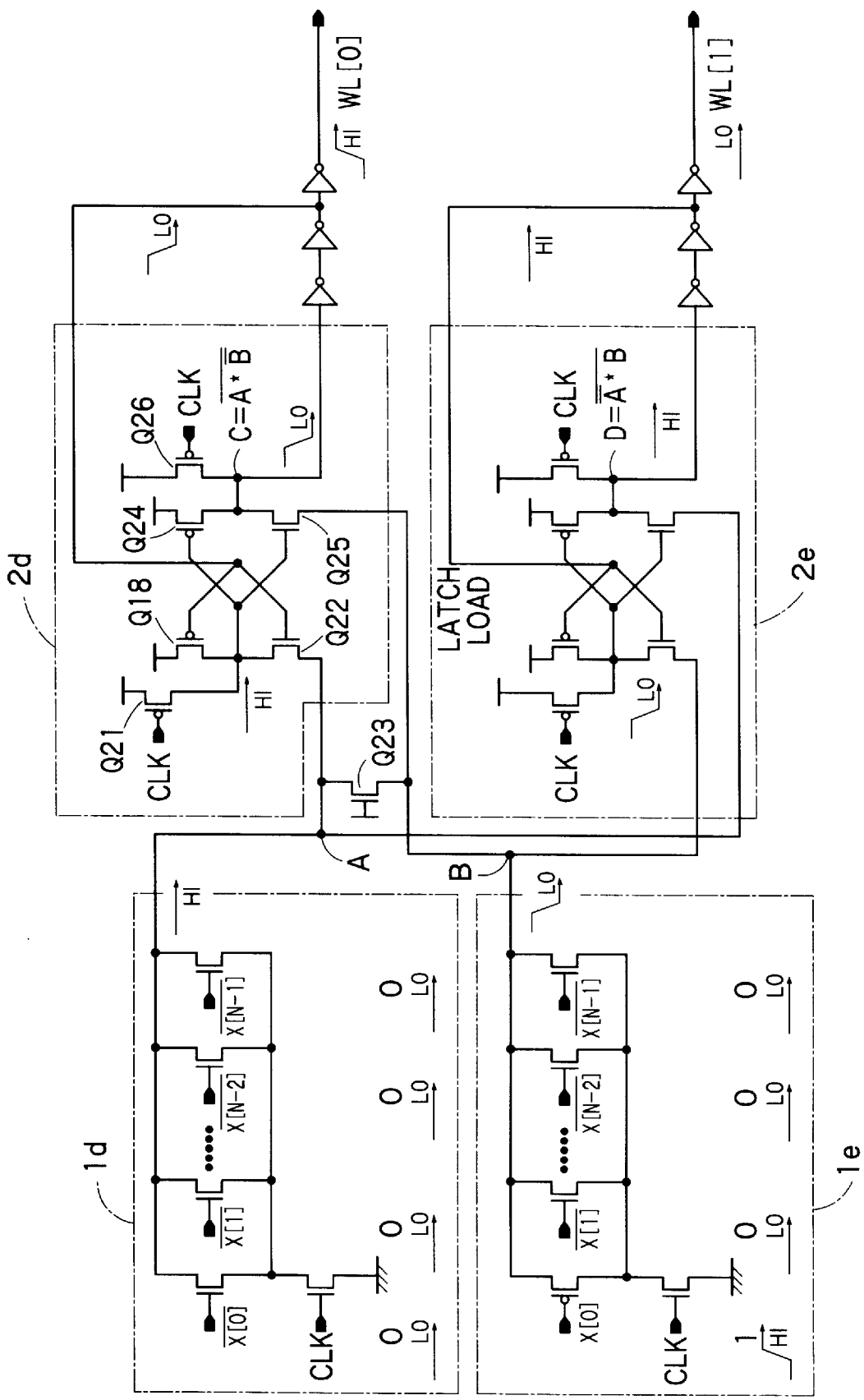
FIG. 13 is a circuit diagram of an eighth embodiment of a semiconductor integrated circuit according to the present invention.

FIG. 13 is a circuit diagram of the eighth embodiment of a semiconductor integrated circuit according to the present invention. In FIG. 13, the same reference numerals are denoted to constituent parts common to FIG. 12, and points different from FIG. 12 will be mainly described hereinafter.

The semiconductor integrated circuit shown in FIG. 13 is different from the circuit illustrated in FIG. 12 in the structure of the keeper circuits 2d and 2e. The keeper circuits 2d and 2e shown in FIG. 13 respectively include a PMOS transistor (third transistor) Q24 cross-multiplied with the PMOS transistor Q18, an NMOS transistor (fourth transistor) Q25 cross-multiplied with the NMOS transistor Q22, and a PMOS transistor Q26 for pre-charge connected to the PMOS transistor Q24 in parallel.

The PMOS transistor Q18 and the NMOS transistor Q22 are controlled to be turned on/off in accordance with the output logic of the keeper circuits 2d and 2e. In addition, respective drain terminals of the PMOS transistors Q24 and Q26 and the NMOS transistor Q25 are connected in common.

When the output of the keeper circuit 2d turns to the low level, the PMOS transistor Q18 is turned on and the NMOS transistor Q22 is turned off. Therefore, the drain terminal of the PMOS transistor Q18 turns to the high level, and the PMOS transistor Q24 is turned off while the NMOS transistor Q25 is turned on. As a result, the output signal of the other first logic operation circuit 1e is outputted from the keeper circuit 2d through the NMOS transistor Q25.

On the other hand, when the output of the keeper circuit 2d turns to the high level, the PMOS transistor Q18 is turned off and the NMOS transistor Q22 is turned on. Consequently, the PMOS transistor Q24 and the NMOS transistor Q25 are controlled to be turned on/off in accordance with the output logic of the first logic operation circuit 1d.

As similar to the seventh embodiment, even if the output logics of the first logic operation circuits 1d and 1e changes, the keeper circuits 2d and 2e in the eighth embodiment operate so as not to prevent the change, thereby increasing the operating speed.

In the above-described first to fourth embodiments, although description has been given on the example where the three first logic operation circuits are provided, the number of the first logic operation circuits may be not less than four or it may be two.

Additionally, in the foregoing fifth to eighth embodiments, although the example where the two first logic operation circuits are provided has been explained, a number of the first logic operation circuits may be not less than three.

What is claimed is:

1. A semiconductor integrated circuit having a logical operation function, comprising:

at least three of first logic operating means configured to output the results of different logic operations executed with respect to a plurality of input signals, any one of said at least three of first logic operating means outputting a signal having first logic in accordance with logic of said plurality of input signals; and a plurality of keeper circuits which are provided respectively corresponding to said at least three of first logic operating means and can maintain an output voltage of said corresponding first logic operating means at a voltage in accordance with second logic, wherein each of said plurality of keeper circuits forcibly sets an output from said corresponding logic arithmetic operating means to said second logic when an output from said first logic operating means other than said corresponding first logic operating means is said first logic.

2. The semiconductor integrated circuit according to claim 1, wherein each of said plurality of keeper circuits includes:

pre-charging means capable of maintaining an output voltage of said corresponding first logic operating means at a voltage in accordance with said second logic when a clock has predetermined logic; and a plurality of transistors which are turned on/off in accordance with output logic of said first logic operating means other than said corresponding first logic operating means.

3. The semiconductor integrated circuit according to claim 1, wherein said first logic is at a low level and said second logic is at a high level;

all of said plurality of transistors are PMOS transistors; and an output signal of said first logic operating means other than said corresponding first logic operating means is inputted to gate terminals of said PMOS transistors.

4. The semiconductor integrated circuit according to claim 1, wherein each of said plurality of keeper circuits includes:

pre-charging means capable of maintaining an output voltage of said corresponding first logic operating means at a voltage in accordance with said second logic when a clock has predetermined logic;

second logic operating means which are provided respectively corresponding to said first logic operating means and execute a predetermined logic operation by using output logic of all of said plurality of first logic operating means other than said corresponding first logic operating means; and a transistor which is turned on/off in accordance with output logic of said second logic operating means, an output terminal of said pre-charging means, a drain terminal of said transistor and an output terminal of said corresponding first logic operating means being connected in common, a signal in accordance with output logic of said corresponding first logic operating means being outputted from a connection point of these terminals.

5. The semiconductor integrated circuit according to claim 4, wherein said first logic is at a low level and said second logic is at a high level;

said second logic operating means execute an NOR operation by using output logic of said first logic operating means other than said corresponding first logic operating means; and said transistor is a PMOS transistor and an output signal of said corresponding second logic operating means is inputted to a gate terminal of said PMOS transistor.

6. The semiconductor integrated circuit according to claim 1, wherein each of said plurality of keeper circuits includes:

pre-charging means configured to pre-charge output logic of said corresponding first logic operating means to said second logic when a clock has predetermined logic;

second logic operating means executing a predetermined logic operation based on output logic of said first logic operating means other than said corresponding first logic operating means;

a first transistor which is turned on/off in accordance with output logic of said second logic operating means; and a second transistor which is connected between said corresponding first logic operating means and said corresponding first transistor and turned on/off in accordance with output logic of said corresponding second logic operating means, said semiconductor integrated circuit further comprising aplurality of third transistors which are connected between output terminals of said adjacent two first logic operating means and constantly maintain the ON state, wherein an output terminal of said pre-charging means and a connection point between said first and second transistors are connected to each other, a signal in accordance with output logic of said corresponding first logic operating means being outputted from said connection point.

7. The semiconductor integrated circuit according to claim 1, wherein each of said plurality of keeper circuits includes:

pre-charging means capable of maintaining an output voltage of said corresponding first logic operating means at a voltage in accordance with said second logic when a clock has predetermined logic;

second logic operating means configured to execute a predetermined logic operation based on output logic of said first logic operating means other than said corresponding first logic operating means;

a first transistor which is turned on/off in accordance with output logic of said first logic operating means;

a second transistor which is connected between said corresponding first logic operating means and said first transistor and turned on/off in accordance with an output signal of said corresponding second logic operating means;

a third transistor which is turned on/off based on a signal in accordance with output logic of said corresponding keeper circuit; and potential setting means configured to set a source voltage of said third transistor to a voltage corresponding to said first logic when a clock has predetermined logic, an output terminal of said pre-charging means and each drain terminal of said first, second and third transistors being connected with each other, a signal in accordance with an output signal of said corresponding logic operating means being outputted from a connection point of these terminals.

8. The semiconductor integrated circuit according to claim 6, wherein said first logic is at a low level and said second logic is at a high level;

said second logic operating means executes an NOR operation by using outputs of said first logic operating means other than said corresponding first logic operating means; and said first transistor is a PMOS transistor and said second transistor is an NMOS transistor, an output signal of said second logic operating means being inputted to gate terminals of these transistors.

9. The semiconductor integrated circuit according to claim 7, wherein said first logic is at a low level and said second logic is at a high level;

said second logic operating means executes an NOR operation by using outputs of said first logic operating means other than said corresponding first logic operating means; and said first transistor is a PMOS transistor and said second transistor is an NMOS transistor, an output signal of said second logic operating means being inputted to gate terminals of these transistors.

10. A semiconductor integrated circuit having a logical operation function, comprising:

at least two of first logic operating means configured to output the results of different logic operations executed with respect to a plurality of input signals, only one of said at least two of first logic operating means outputting a signal having first logic in accordance with logic of said plurality of input signals; and a plurality of keeper circuits provided respectively corresponding to said at least two of first logic operating means, wherein each of said plurality of keeper circuits includes:

a first transistor capable of maintaining an output voltage of said corresponding first logic operating means at a voltage in accordance with second logic; and second logic operating means configured to execute a predetermined logic operation by using output signals from said plurality of first logic operating means, said first transistor being controlled to be turned on/off based on output logic of said second logic operating means.

11. The semiconductor integrated circuit according to claim 10, wherein said second logic operating means executes an NAND operation based on an output signal of said first logic operating means other than said corresponding first logic operating means when output logic of said corresponding first logic operating means is said second logic, and outputs a predetermined signal having said first logic or said second logic when output logic of said corresponding first logic operating means is said first logic.

12. A semiconductor integrated circuit having a logical operation function, comprising:

at least two of first logic operating means configured to output the results of different logic operations executed with respect to a plurality of input signals, only one of said at least two of first logic operating means outputting a signal having first logic in accordance with logic of said plurality of input signals; and a plurality of keeper circuit s provided respectively corresponding to said at least two of first logic operating means, wherein each of said plurality of keeper circuits includes:

a first transistor capable of maintaining an output voltage of said corresponding first logic operating means at a voltage in accordance with second logic;

a second transistor which is cross-multiplied with said first transistor and is capable of outputting a voltage in accordance with said second logic; and a third transistor configured to output a voltage in accordance with an output from said first logic operating means other than said corresponding first logic operating means when output logic of said corresponding first logic operating means is said second logic, said second transistor being turned on to output a voltage in accordance with said second logic when an output from said corresponding first logic operating means is said first logic, said first transistor being turned on to maintain an output voltage of said corresponding first logic operating means at a voltage in accordance with said second logic when an output logic of said corresponding keeper circuit is said first logic.

13. The semiconductor integrated circuit according to claim 10, wherein said first logic is at a low level and said second logic is on high level, and said first and second transistors are PMOS transistors and said third transistor is an NMOS transistor.

14. A semiconductor integrated circuit having a logical operation function, comprising:

at least two of first logic operating means configured to output results of different logic operations executed with respect to a plurality of input signals, at least one of said at least two of first logic operating means outputting a signal having first logic in accordance with logic of said plurality of input signals;

second logic operating means which are provided respectively corresponding to said at least two of first logic operating means and execute a predetermined logic operation by using output signals of said plurality of first logic operating means;

first and second transistors which are provided respectively corresponding to said at least two of first logic operating means and connected in series; and pre-charging means capable of maintaining a voltage of a connection point of said first and second transistors at a predetermined voltage, wherein said first and second transistors are controlled to be turned on/off based on an output from said second logic operating means, said second logic operating means outputting a signal in accordance with an output of said first logic operating means other than said corresponding first logic operating means when said first transistor is turned on and outputting a signal in accordance with output logic of said corresponding first logic operating means when said first transistor is turned off.

15. The semiconductor integrated circuit according to claim 14, wherein said second logic operating means executes an NAND operation between a signal in accordance with a voltage at a connection point of said corresponding first and second transistors and a signal in accordance with a voltage at a connection point of any other first and second transistors.

16. The semiconductor integrated circuit according to claim 14, wherein said second logic operating means includes third and fourth transistors connected in series;

said third and fourth transistors are controlled to be turned on/off by a voltage at a connection point of said corresponding first and second transistors; and said third and fourth transistors are of different conduction types, said second logic operating means outputting a predetermined signal having said first logic or said second logic when said third transistor is turned on, said second logic operating means outputting a signal in accordance with an output signal of said first logic operating means other than said corresponding first logic operating means when said fourth transistor is turned on.

17. The semiconductor integrated circuit according to claim 16, wherein said first logic is at a low level and said second logic is at high level; and said first and third transistors are PMOS transistors and said second and fourth transistors are NMOS transistors.

18. The semiconductor integrated circuit according to claim 14, further comprising a transistor which is connected between respective output terminals of said adjacent two first logic operating means and constantly maintains the ON state.

19. The semiconductor integrated circuit according to claim 15, further comprising a transistor which is connected between respective output terminals of said adjacent two first logic operating means and constantly maintains the ON state.

20. The semiconductor integrated circuit according to claim 16, further comprising a transistor which is connected between respective output terminals of said adjacent two first logic operating means and constantly maintains the ON state.

* * * * *